United States Patent
Rousseil et al.

(10) Patent No.: US 9,948,266 B2
(45) Date of Patent: Apr. 17, 2018

(54) ELECTRICAL FILTER, ELECTRICAL EQUIPMENT WHICH IS PROVIDED WITH SUCH A FILTER AND A VEHICLE WHICH IS EQUIPPED WITH SUCH EQUIPMENT

(71) Applicant: Valeo Systemes Thermiques, Le Mesnil Saint Denis (FR)

(72) Inventors: Xavier Rousseil, Vanves (FR); Jonathan Fournier, Le Perray-en-Yvelines (FR); Xavier Goumain, Montigny-le-Bretonneux (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 0 days.

(21) Appl. No.: 15/264,656

(22) Filed: Sep. 14, 2016

(65) Prior Publication Data

US 2017/0077890 A1    Mar. 16, 2017

(30) Foreign Application Priority Data

Sep. 15, 2015   (FR) ...................................... 15 58602

(51) Int. Cl.
*H02P 6/28* (2016.01)
*H03H 7/09* (2006.01)
*H03H 7/01* (2006.01)
*H03H 7/42* (2006.01)

(52) U.S. Cl.
CPC ............. *H03H 7/0138* (2013.01); *H02P 6/28* (2016.02); *H03H 7/427* (2013.01)

(58) Field of Classification Search
USPC ..... 318/623, 629, 400.23, 400.24, 700, 702, 318/448, 558
See application file for complete search history.

(56) References Cited

U.S. PATENT DOCUMENTS

| 2,546,837 A | * | 3/1951 | Stribling, Jr. ............. H03F 3/54 330/124 R |
| 2,787,767 A | * | 4/1957 | Goldsmith ........... H03H 1/0007 174/126.1 |
| 3,422,225 A | * | 1/1969 | Griese Hans-Joachim ........... H03F 3/70 307/400 |
| 5,408,165 A | * | 4/1995 | Voet .......................... H02J 3/26 318/523 |

* cited by examiner

*Primary Examiner* — Bentsu Ro
(74) *Attorney, Agent, or Firm* — Osha Liang LLP

(57) ABSTRACT

An electrical filter (10) is suitable for having a greater effectiveness for reducing the common mode current that an electrical device (30) can produce in the direction of a voltage source (20) which is used to supply this device. Such a filter can be useful for meeting the electromagnetic compatibility requirements set by the BMW Group Standard GS 95002-2 "Electromagnetic Compatibility (EMC)—requirements and tests on components up to 60 V nominal voltage".

11 Claims, 3 Drawing Sheets

ELECTRICAL FILTER, ELECTRICAL EQUIPMENT WHICH IS PROVIDED WITH SUCH A FILTER AND A VEHICLE WHICH IS EQUIPPED WITH SUCH EQUIPMENT

The present invention relates to an electrical filter, electrical equipment which is provided with such a filter and a vehicle which is equipped with such equipment.

The electromagnetic compatibility standards, designated by the acronym EMC, place limitations on the stray currents which are produced by electrical devices and transmitted to the electrical voltage source which supplies each device. These stray currents are often designated by conducted emissions. Indeed, many electrical devices, in particular those the operation of which uses high-frequency commutation, for example brushless motors, also called electronically commutated motors, produce stray currents which can damage other devices which are connected to the same voltage source. In the case of electrical equipment which is mounted in vehicles, these stray currents are a particular annoyance in the frequency band between 76 MHz (megahertz) and 108 MHz, since this band corresponds to FM reception.

These requirements particularly relate to the common mode current which is transmitted by an electrical device to the electrical voltage source used to supply it with energy. In a known manner, the common mode current designates an electric current which is retransmitted by the device to the voltage source with intensities that are identical in all of the electrical connections which connect the source to the device, and with a current flow direction that is common to all of these connections: from the device in the direction of the voltage source.

The BMW Group Standard GB 95002-2: "Electromagnetic Compatibility (EMC)—requirements and tests on components up to 60 V nominal voltage" requires that the part of the common mode current which is conducted by each electrical connection, called common mode elementary current in the present description, produces a voltage which is less than 33 dBµV when the frequency thereof is between 3.85 MHz and 26.1 MHz, and when a line impedance stabilization network (LISN) is inserted between the electrical equipment and the voltage source, in a ground connection resistor which is equal to 50Ω (ohm). When the frequency of the common mode current is between 76 MHz and 108 MHz, the electrical voltage in the ground connection resistor must be less than 12 dBµV under the same measurement conditions.

Figure 1:
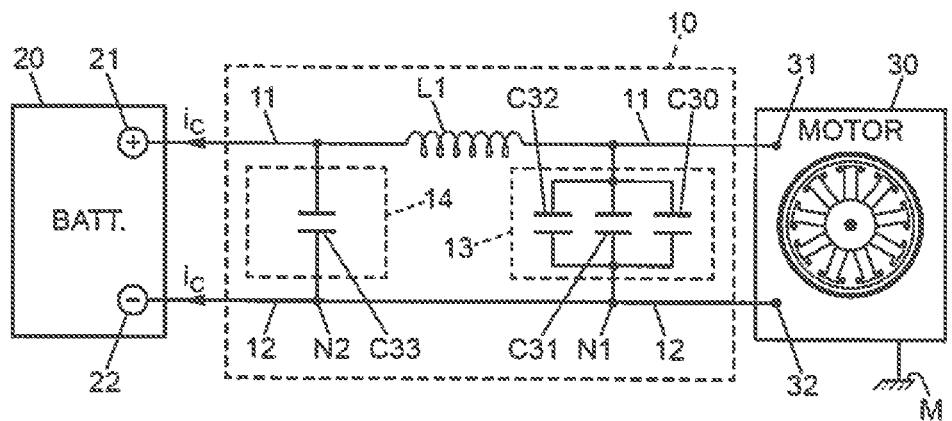

To attempt to meet these EMC requirements, it is known to provide the electrical device that can produce the common mode current with an electrical filter which is connected between the voltage source and the device. With reference to FIG. 1, such an electrical filter 10 can comprise:

- a first electrical connection 11 which is intended to connect a first output terminal 21 of the source 20 to a first electrical supply terminal 31 of the device 30, this first connection 11 comprising a first coil L1;
- a second electrical connection 12 which is intended to connect a second output terminal 22 of the source 20 to a second electrical supply terminal 32 of the device 30;
- a first capacitive assembly 13 which can comprise at least one capacitor C30-C32, this first capacitive assembly 13 being connected firstly to the first connection 11 between the first coil L1 and the first electrical supply terminal 31 of the device 30, and connected secondly to the second connection 12 via a first node N1; and
- a second capacitive assembly 14 which can comprise at least another capacitor C33, this second capacitive assembly 14 being connected firstly to the first connection 11 between the first output terminal 21 of the source 20 and the first coil L1, and connected secondly to the second connection 12 by a second node N2, the first node N1 being located in the second electrical connection 12 between the second node N2 and the second electrical supply terminal 32 of the device 30.

Such an electrical filter is commonly called a pi filter. However, when the common mode current which is produced by the electrical device has significant spectral components above 76 MHz, the use of such a pi filter can be insufficient to meet the requirements indicated above. In other words, for frequencies greater than 76 MHz, the voltage which is generated in the 50Ω ground connection resistor by inserting a line impedance stabilization network on the connection which is the subject of the measurement, between the device and the voltage source, can be greater than 12 dBµV.

Based on this situation, an aim of the present invention is to further reduce the common mode current for the frequencies which are greater than 76 MHz. This reduction is sought preferably such that the voltage which is produced by this common mode current in a 50Ω ground connection resistor is less than 12 dBµV by using a line impedance stabilization network between the electrical equipment and the electrical voltage source.

Other aims of the invention are to propose a new electrical filter suitable for reducing the common mode current, which is compact, inexpensive, and easy to implement using a pi filter such as stated above.

To this end, a first aspect of the invention proposes the modification of the second connection of the pi filter such that this second connection comprises at least a second coil which is located between the first node and the second node.

Thanks to a second coil which is added to the Pi filter, the requirement for voltage less than 12 dBµV associated with the common mode current under the measurement conditions which have been indicated above can be met for a greater number of electrical devices.

Furthermore, such an addition of a second coil in the pi filter results in little additional spatial requirement, is inexpensive and easy to implement.

In improvements of the invention, the first and second coils are positioned with respect to one another in order to produce a magnetic interaction therebetween. In this case, they have respective winding directions such that equal and variable electric currents which enter the electrical source via the first and second output terminals, one current separately via each output terminal, produce in each of the coils a voltage contribution by mutual induction and a voltage contribution by self-induction which have a same sign for this coil, on average for a duration of use of the filter. The effectiveness of the electrical filter can, therefore, be further improved, particularly for frequencies which are greater than 76 MHz. In particular, the first and second coils can be coupled, and one of these coils can be coiled in the clockwise direction whereas the other can be coiled in the anticlockwise direction.

Furthermore, a difference between the inductance value of the first coil and that of the second coil can be less than or equal to 20%, preferably less than or equal to 10%, of the inductance value of each of the coils. Such an inductance value closeness is furthermore favourable for reducing a differential mode current which is produced by the electrical device through the electrical voltage source.

In particular, the first coil can have an inductance value which is between 0.1 and 1 µH. Independently or in combination, the second coil can also have an inductance value which is between 0.1 and 1 µH. Generally, the inductance value of a coil means the self-inductance value thereof.

Furthermore, the first capacitive assembly can comprise at least a capacitor, like the second capacitive assembly.

The first capacitive assembly can have a capacitance value which is between 300 and 3000 µF. At the same time, the second capacitive assembly can have a capacitance value which is between 100 and 1000 µF.

A second aspect of the invention proposes electrical equipment which comprises an electrical device having at least two electrical supply terminals, and an electrical filter which is in accordance with the first aspect of the invention. The first and second electrical connections of the filter are then connected one-by-one to the two electrical supply terminals of the device such that the first capacitive assembly is connected electrically in parallel with the device between the two electrical supply terminals of the latter. In such electrical equipment, the electrical device can comprise a brushless motor.

The electrical device can comprise a motorized fan unit.

The electrical equipment for which the invention is used can form a heating, ventilation and air conditioning system for a vehicle interior. In this case, the electrical device comprises a motor which is arranged to ventilate the interior.

Preferably, the first and second coils, and the first and second capacitive assemblies can be selected such that a common mode elementary current which is produced by the equipment and transmitted to the electrical voltage source by either of the output terminals thereof, called a test terminal, produces a voltage which is less than 12 dBµV at a frequency of 80 MHz, when a line impedance stabilization network is inserted between the test terminal and that of the first or second connection of the filter to which the test terminal is connected, and when a resistor equal to 50Ω is connected between the line impedance stabilization network and the ground terminal of the electrical device, the voltage being measured between two ends the resistor.

Finally, a third aspect of the invention proposes a vehicle which comprises a battery having at least two output terminals, and electrical equipment which is in accordance with the second aspect of the invention. The first and second connections of the filter are than connected one-by-one to the two output terminals of the battery such that the second capacitive assembly is connected electrically in parallel with the battery between the two output terminals of the latter. In particular, the electrical equipment of the vehicle, for which the invention is used, can comprise a heating, ventilation and air conditioning system for the interior of the vehicle. In this case, the electrical device can comprise a brushless motor which is arranged to ventilate the interior.

Figure 2:
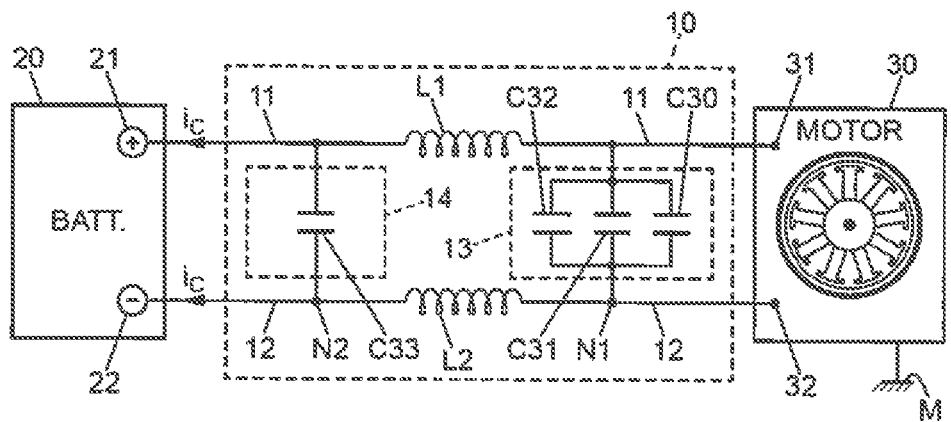
Figure 3A:
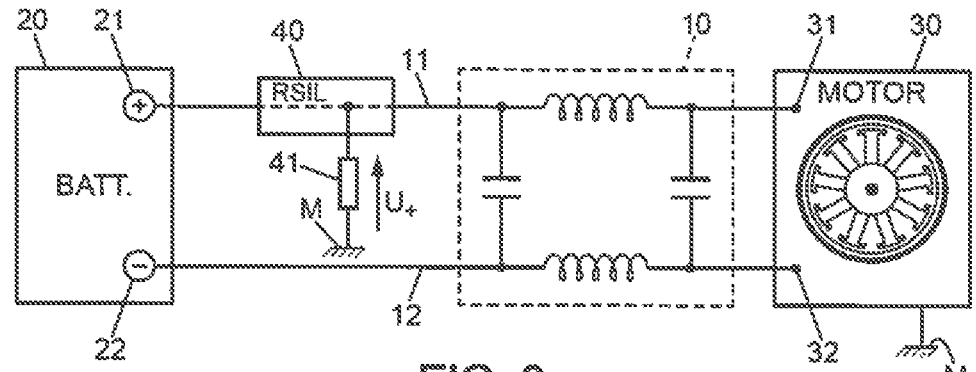
Figure 3B:
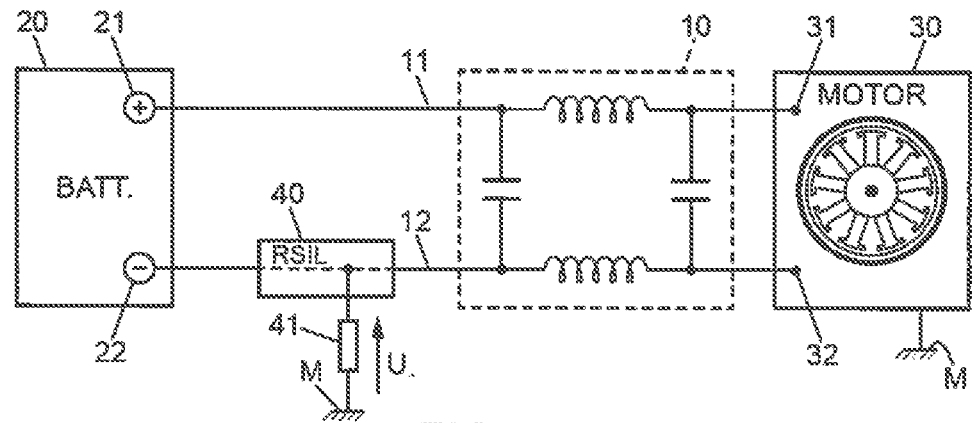
Figure 4A:
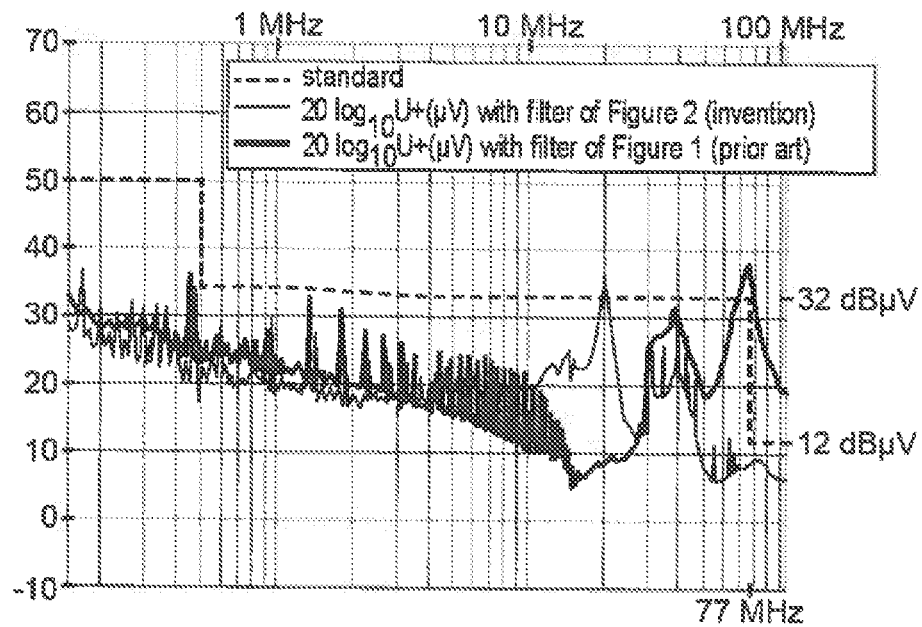
Figure 4B:
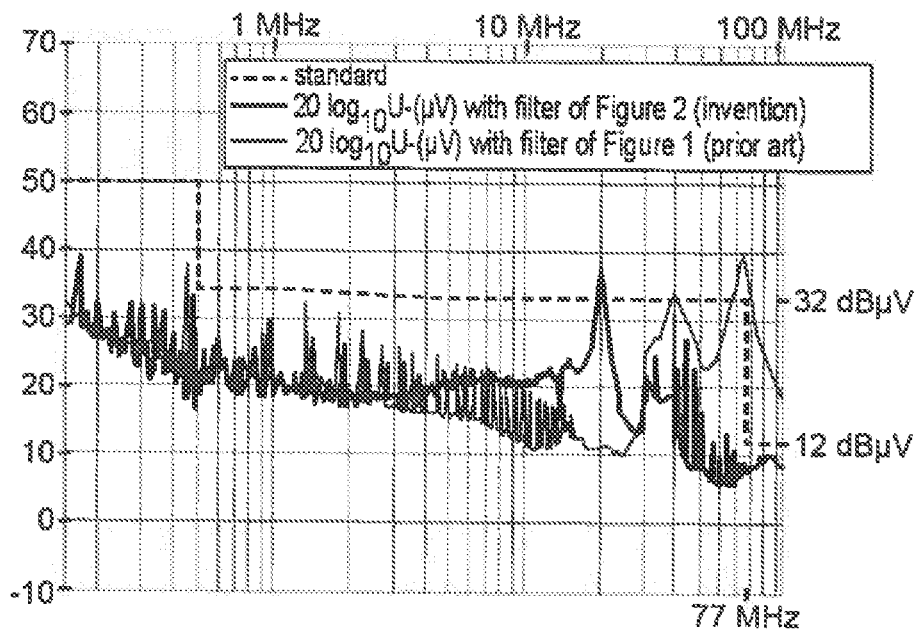

Other features and advantages of the present invention will emerge in the following description of non-limiting embodiments, with reference to the appended drawings, wherein:

FIG. 1, which has already been described, is a filter electrical diagram as known prior to the present invention;

FIG. 2 corresponds to FIG. 1 with regard to an electrical filter in accordance with the present invention:

FIGS. 3a and 3b show two test installations which are used to characterize a common mode current produced by electrical equipment provided with the filter of FIG. 2; and FIGS. 4a and 4b are two spectral diagrams for characterizing the common mode current, for the test installations of FIGS. 3a and 3b, respectively.

Identical references which are indicated in FIGS. 1 to 3 designate elements that are identical or which have identical functions.

From FIG. 1, the filter of the invention, which is again referenced 10, is obtained by adding a coil L2 as shown in FIG. 2. The coil L2 is located in the electrical connection 12 between the nodes N1 and N2. The capacitors C30-C32, of which there are three for example, which are connected in parallel with each other, between the first connection 11 and the node N1 in the second connection 12, form the first capacitive assembly 13. The capacitor C32 which is connected between the first connection 11 and the node N2 in the second connection 12, forms the second capacitive assembly 14. Along the first connection 11, the coil L1 is located between the connection of the first capacitive assembly 13, on the electrical device 30 side, and the connection of the second capacitive assembly 14, on the electrical source 20 side.

The electrical source 20 can be a battery noted BATT., for example a motor vehicle battery.

The electrical device 30 can be a motor noted MOTOR, particularly a brushless motor, or a motor inverter. For example, it can be a motor for ventilating the interior of the vehicle, which is part of a heating, ventilation and air conditioning system. M designates a ground terminal of the electrical device 30.

The filter 10 of the invention, comprising the second coil L2, and the electrical device 30 jointly form electrical equipment in accordance with the invention.

The electrical filter 10 in accordance with the invention can be produced on a printed circuit board (PCB), with discrete components which are attached to this board. For example, each of the capacitors C30-C33 can have a capacitance value equal to 330 µF (microfarad), forming a capacitance total value equal to 990 µF for the capacitive assembly 13, and each of the coils L1 and L2 can have an inductance value equal to 0.43 µH (microhenry).

The common mode current is made up of two equal currents, which are called common mode elementary currents and noted $i_C$ in the FIGS. 1-3, and which flow towards the voltage source 20 separately via the output terminals 21 and 22, from the connections 11 and 12, respectively. The common mode current can be looped back by the ground terminal M by capacitive effect.

FIG. 3a illustrates a method of characterizing the common mode current of the conducted emissions, by characterizing the common mode elementary current $i_C$ which is transmitted by the connection 11 to the output terminal 21 of the source 20. To this end, a line impedance stabilization network 40, noted RSIL, is inserted between the filter 10 and the output terminal 21, on the connection 11. The network 40 is a commercially available model, and the use thereof is assumed to be known to a person skilled in the art. The network 40 is connected, furthermore, to the ground terminal M of the device 30 via a 50Ω (ohm) resistor 41. The electrical voltage noted $U_+$, which then exists in the resistor 41 when the device 30 is supplied with electrical energy by the source 20, is analyzed as a function of the frequency of the common mode current.

The diagram of FIG. 4a shows the result of such an analysis. The horizontal axis identifies the values of the frequency given in MHz, on a logarithmic scale, and the vertical axis identifies the values of $20 \cdot \log_{10}(U_+)$, in decibels when $U_+$ is given in microvolts (µV). In this diagram, the broken line represents the maximum limit allowed by the BMW Group Standard GS 95002-2: "Electromagnetic Compatibility (EMC)—requirements and tests on components up to 60 V nominal voltage", for the voltage $U_+$ representing the common mode current. The curve in thin continuous line of FIG. 4a is the spectral characteristic of the voltage $U_+$ when the device 30 is provided with the filter 10 in accordance with the invention, as shown in FIG. 2 and with the numerical values of capacitance and inductance which have been indicated above. The characteristic of the voltage $U_+$ is located below the limit stipulated by the BMW Group Standard GS 95002-2 when the frequency is greater than 22 MHz. Furthermore, the voltage $U_+$ only exceeds the limit of the BMW Group Standard GS 95002-2 at the frequency of 20 MHz by 2 dBμV and this can be easily stopped using an additional filter.

By comparison, the diagram of FIG. 4a also shows (curve in thick continuous line) the spectral characteristic of the voltage $U_+$ representing the common mode current, when a filter 10 which is in accordance with FIG. 1 is used for the same electrical device 30, in place of the filter of FIG. 2. The capacitance values which are used in this filter 10 that is not in accordance with the invention are the same as above. The value of the inductance L1 is then 0.86 μH, for a total value of inductance in the filter which is equal to that of the filter in accordance with the invention, which filter has been previously tested. With the filter of FIG. 1 (without coil L2), the characteristic of the voltage $U_+$ increases to 34 dBμV, i.e. 22 dBμV above the limit which is stipulated by the BMW Group Standard GS 95002-2 for the 76 MHz frequency. The transfer of a half (0.43 mH) of the inductance total value from the connection 11 to the connection 12 therefore allows the resonance peak of the common mode current to be shifted, from the frequency value of 73 MHz approximately (curve in thick continuous line in FIG. 4a, relative to the filter of FIG. 1, which is not in accordance with the invention) to the frequency value of 20 MHz approximately (curve in fine continuous line in FIG. 4a, relative to the filter of FIG. 2, in accordance with the invention). A particular benefit for this resonance frequency shift of the common mode current lies in the maximum value which is stipulated by the standard—33 dBμV at 20 MHz instead of 12 dBμV at 80 MHz—and from the importance of observing this standard for the 76-108 MHz frequency band, used for FM reception.

FIGS. 3b and 4b correspond to FIGS. 3a and 4a, respectively, when the common mode current is tested on the connection 12. The line impedance stabilization network 40 is now inserted between the filter 10 and the output terminal 22 of the battery 20, on the connection 12. The resistor 41 is still equal to 50Ω and the electrical voltage which is measured in the resistor 41 when the device 30 is supplied with electrical energy by the source 20 is noted $U_+$. The electrical device 30 is the same as for FIGS. 3a and 4a, and the diagram of FIG. 4b reproduces the spectral analysis of $20 \cdot \log_{10}(U_+)$. This diagram leads to the same conclusions as that of FIG. 4a, to prove the benefit of the invention.

Furthermore, the filter which is just been described is effective at the same time for reducing differential mode currents which are produced by the electrical device 30 through the electrical voltage source 20.

The effectiveness of the filter of the invention (FIG. 2) can be increased by bringing the installation locations of the two coils L1 and L2 closer to one another on the printed circuit board, such that there is a magnetic interaction between these two coils. Possibly, the two coils L1 and L2 can be arranged about a shared magnetic core, in order to further increase this interaction. In a known manner, a nonzero mutual inductance value is then part of the effectiveness of the filter. The sign, which is positive or negative, of this mutual inductance value depends on the respective winding directions of the two coils L1 and L2. The effectiveness of the filter in accordance with the invention is increased or reduced as a function of this sign. To increase this effectiveness, the contribution of the common mode elementary current $i_C$ which flows in the connection 11, to the electrical voltage which exists between the terminals of the coil L2 by mutual induction effect, has, on average, over a sufficiently long duration with respect to the considered frequency, the same sign as the contribution by self-induction of the common mode elementary current $i_C$ which flows in the connection 12. Likewise, the contribution of the common mode elementary current $i_C$ which flows in the connection 12, to the electrical voltage which exists between the terminals of the coil L1 by mutual induction effect, has, on average, over a sufficiently long duration with respect to the considered frequency, also the same sign as the contribution by self-induction of the common mode elementary current $i_C$ which flows in the connection 11. Upon reading this description, a person skilled in the art can select the winding directions of the two coils L1 and L2 which are favourable for increasing the effectiveness of the filter.

It is understood that the invention can be reproduced by modifying some secondary aspects which have been described in detail above, while retaining some of the cited advantages at least. In particular, the numerical values which have been cited have only been given by way of nonlimiting example. In particular, these values can be adjusted depending on the electrical and spectral characteristics of the electric device with which the filter is associated.

The invention claimed is:
1. An electrical filter suitable for being connected between an electrical voltage source and an electrical device, said filter comprising:
  a first electrical connection that connects a first output terminal of the electrical voltage source to a first electrical supply terminal of the electrical device, said first electrical connection comprising a first coil;
  a second electrical connection that connects a second output terminal of the electrical voltage source to a second electrical supply terminal of the electrical device, said second electrical connection comprising a second coil;
  a first capacitive assembly connected, via a first terminal of the first capacitive assembly, between the first coil and the first electrical supply terminal of the electrical device, and connected, via a second terminal of the first capacitive assembly, between the second electrical supply terminal of the electrical voltage source and the second coil; and
  a second capacitive assembly connected, via a first terminal of the second capacitive assembly, between the first output terminal of the electrical voltage source and the first coil, and connected, via a second terminal of the second capacitive assembly, between the second output terminal of the electrical voltage source and the second coil;
  wherein a difference between an inductance value of the first coil and an inductance value of the second coil is less than or equal to 20% of the inductance value of each of said first and second coils,
  wherein the electrical device is selected from the group consisting of a brushless motor and a motorized fan.

2. The filter according to claim 1, wherein the first capacitive assembly comprises at least one capacitor.

3. The filter according to claim 1, wherein the second capacitive assembly is comprised of a single capacitor or at least two capacitors connected in parallel.

4. The filter according to claim 1, wherein the first and second coils are positioned with respect to one another in order to produce a magnetic interaction therebetween, and have respective winding directions such that equal and variable electric currents which enter the source via the first and second output terminals, one of said currents separately via each output terminal, produce in each of the coils a voltage contribution by mutual induction and a voltage contribution by self-induction which have a same sign for said coil, on average for a duration of use of the filter.

5. The filter according to claim 1, wherein the first and second coils are coupled, and wherein one of said first and second coils is coiled in the clockwise direction, and the other of said first and second coils is coiled in the anticlockwise direction.

6. The filter according to claim 1, wherein the first coil has an inductance value between 0.1 and 1 µH.

7. The filter according to claim 1, wherein the second coil has an inductance value between 0.1 and 1 µH.

8. The filter according to claim 1, wherein:
the first capacitive assembly has a capacitance value between 300 and 3000 µF; and
the second capacitive assembly has a capacitance value between 100 and 1000 µF.

9. An electrical equipment comprising:
an electrical device having two electrical supply terminals; and
the filter according to claim 1, wherein the first and second electrical connections of the filter are connected one-by-one to the two electrical supply terminals of the device such that the first capacitive assembly is connected electrically in parallel with the device between said two electrical supply terminals of the device.

10. The equipment according to claim 9, forming a heating, ventilation and air conditioning system for a vehicle interior, wherein the electrical device comprises a motor arranged to ventilate the interior.

11. The equipment according to claim 9, wherein the first and second coils, and the first and second capacitive assemblies are selected such that a common mode elementary current which is produced by the equipment and transmitted to the electrical voltage source by either of the output terminals of said source, called a test terminal, produces a voltage which is less than 12 dBµV at a frequency of 80 MHz, when a line impedance stabilization network is inserted between said test terminal and that of the first or second connection of the filter to which said test terminal is connected, and when a resistor equal to 50Ω is connected between said line impedance stabilization network and a ground terminal of the electrical device, said voltage being measured between two ends of said resistor.

* * * * *